US007456442B2

(12) United States Patent
Munns

(10) Patent No.: US 7,456,442 B2
(45) Date of Patent: *Nov. 25, 2008

(54) SUPER LATTICE MODIFICATION OF OVERLYING TRANSISTOR

(75) Inventor: Gordon Munns, Stacy, MN (US)

(73) Assignee: International Rectifier Corporation, El Segundo, CA (US)

( * ) Notice: Subject to any disclaimer, the term of this patent is extended or adjusted under 35 U.S.C. 154(b) by 160 days.

This patent is subject to a terminal disclaimer.

(21) Appl. No.: 11/450,806

(22) Filed: Jun. 8, 2006

(65) Prior Publication Data

US 2006/0237745 A1 Oct. 26, 2006

Related U.S. Application Data

(63) Continuation of application No. 10/723,382, filed on Nov. 25, 2003, now Pat. No. 7,112,830.

(60) Provisional application No. 60/428,856, filed on Nov. 25, 2002.

(51) Int. Cl.
*H01L 31/0328* (2006.01)
*H01L 29/732* (2006.01)

(52) U.S. Cl. .......................... 257/190; 257/12; 257/15; 257/22; 257/183.1; 257/192; 257/E29.072; 257/E29.081

(58) Field of Classification Search .................. 257/12, 257/15, 22, 183, 183.1, 187, 190, 192, E29.072, 257/E29.081, E29.085, E29.091, E29.097
See application file for complete search history.

(56) References Cited

U.S. PATENT DOCUMENTS 6,462,361 B1 * 10/2002 Udagawa et al. ............ 257/194
2003/0178633 A1 * 9/2003 Flynn et al. ................ 257/101

* cited by examiner

*Primary Examiner*—Matthew E Warren
(74) *Attorney, Agent, or Firm*—Ostrolenk, Faber, Gerb & Soffen, LLP

(57) ABSTRACT

The invention provides a device having a substrate, a buffer region positioned upon the substrate, wherein the buffer region has an upper buffer region and a lower buffer region, a heterojunction region positioned upon the buffer region, and a superlattice positioned between the lower buffer region and the upper buffer region, wherein the device is configured to function as a heterojunction field effect transistor.

28 Claims, 15 Drawing Sheets

125
130
115
113
120
110
112
105

125
130
140
115
140
113
120
110
112
105

125
135
130
140
140
115
113
120
112
105

A
B
OMEGA-2THETA (ARCSEC)
OMEGA (deg)
Log Intensity
Al0.25Ga0.75N
Al0.12Ga0.33N
GaN Source on, to dump line
Source on, to reactor
Temp (deg.C)
Flow (sccm, sim)
980°C
640°C
RT
Temp
H2,NH3 stopped 350°C
NH3,1.5sim
H2, 1.2slm
TEAl, 100SCCM
Si2H6, 40 sccm 214
TEGa,40 sccm
5x(~1:30GaN;1:30iA(GaN)
304 308 312 316 320
306 310 314 318
TEGa,10 sccm
TEGa, 10sccm
210
212
302
212
216
218
8min
5min
5min
5min
25min
30sec
15min
30sec
35-75min
30sec
30sec
2min
35min to RT
Time (min)

SUPER LATTICE MODIFICATION OF OVERLYING TRANSISTOR

Cross-Reference to Related Applications

This application is a continuation of U.S. patent application Ser No. 10/723,382, filed on Nov. 25, 2003, now U.S. Pat. No. 7,112,830, issued on Sep. 24, 2006 which claims priority to U.S. Provisional Application No. 60/428,856, filed on Nov. 25, 2002, the entire disclosure of which are incorporated by reference.

FIELD OF THE INVENTION

The invention relates generally to wide bandgap semiconductors and their fabrication. More specifically, the invention relates to wide bandgap semiconductor devices comprising alloys including aluminum, gallium, nitrogen, and indium, and the fabrication of these devices.

BACKGROUND OF THE INVENTION

Gallium nitride and aluminum gallium nitride are wide bandgap semiconductors used in the production of such electrical and opto-electronic devices as blue light emitting diodes, lasers, ultraviolet photodetectors, and power transistors. There are currently no cost effective, lattice matched substrates on which these crystalline materials can be grown. Common exemplary substrates for the growth of these materials are sapphire, silicon, gallium arsenide, and silicon carbide. Each of these materials has significant lattice size differences with respect to the gallium nitride (GaN) or aluminum gallium nitride (AlGaN) crystal structure. For example, the lattice size differences for gallium nitride on sapphire is 16%, gallium nitride on silicon carbide is 3.1%, and gallium nitride on silicon is 17%.

The lattice mismatch between the substrate and the epitaxial overgrown layer is accommodated by a defect in the periodic crystal structure of the epitaxial layers. This defect is called a dislocation. Dislocation densities above $10^4$ $cm^{-2}$ degrade performance of both optical and electronic devices by carrier scattering, catalyzing impurity movement, roughening interfaces, and serving as a parasitic defect/recombination site. In order to preserve smooth interfaces and reduce dislocation densities, a variety of mitigation and density reduction approaches have been proposed in the past.

One of the more well-known approaches uses lateral epitaxial overgrowth. Essentially, the underlying substrate is patterned using a photomask and material is grown in windows opened to the substrate. As the crystal grows, the window tends to overgrow the masked area. In this overgrown area, the threading dislocation density is significantly lower than in the window area (up to 4 orders of magnitude lower). One example of a process such as this can be seen in U.S. Patent Application Publication No. 20010008791 (Gherke, et al.).

The disadvantage of this technique is that the substrate must be patterned and, in turn, area is sacrificed. As a result, there is a need for methods of fabrication and resulting devices that have reduced lattice mismatch between layers.

SUMMARY OF THE INVENTION

The invention provides a device having a substrate, a buffer region positioned upon the substrate, wherein the buffer region has an upper buffer region and a lower buffer region, a heterojunction region positioned upon the buffer region, and a superlattice positioned between the lower buffer region and the upper buffer region. Generally, the device can be configured to function as a heterojunction field effect transistor.

The invention also provides a device having a substrate made of sapphire, a buffer region positioned upon the substrate, wherein the buffer region has an upper buffer region and a lower buffer region, a heterojunction region positioned upon the buffer region, and a superlattice made of individual layers of GaN and $Al_xGa_{1-x}N$ positioned between the lower buffer region and the upper buffer region. Generally, the device can be configured to function as a heterojunction field effect transistor.

The invention further provides a device having a substrate made of silicon carbide, a buffer region positioned upon the substrate, wherein the buffer region has an upper buffer region and a lower buffer region, a heterojunction region positioned upon the buffer region, and a superlattice made of individual layers of GaN and $Al_xGa_{1-x}N$ positioned between the lower buffer region and the upper buffer region. Generally, the device can be configured to function as a heterojunction field effect transistor.

The invention is a structure and a technique that allows a variety of unpatterned substrates to be used by employing a planarizing multi-layer structure. The structure is integrated into the growth of the epitaxial material and reduces the roughness of the surface while selectively deflecting or filtering threading dislocations. In one embodiment, this structure comprises a superlattice of alternating alloys of GaN and AlGaN. Alternatively, other alloys such as InGaN or AlInGaN may also be used.

The efficacy of the dislocation filter stems from the fact that GaN and AlGaN have slightly different lattice constants. The lattice constant of $Al_xGa_{1-x}N$ is linearly dependent on the magnitude of x. There is built-in biaxial stress and strain when AlGaN is grown atop GaN. The resulting strain field serves as a barrier to propagation of dislocations with a component parallel to the normal growth direction. The addition of aluminum to the alloy during growth serves as a smoothing agent due to the reduced surface mobility of the aluminum (as compared to gallium adatoms).

While the amount of strain necessary to deflect the threading dislocations depends on the details of crystal growth-temperature, flow, precursors, substrate, composition, dislocation density, etc., this invention can create a 20 to 50% increase in the performance of the resulting devices.

The following proposed approach employs heterostructure field effect transistors (HFETs) fabricated of AlGaN/GaN grown on semi-insulating substrates.

DETAILED DESCRIPTION OF THE PREFERRED EMBODIMENTS

Figure 1A:
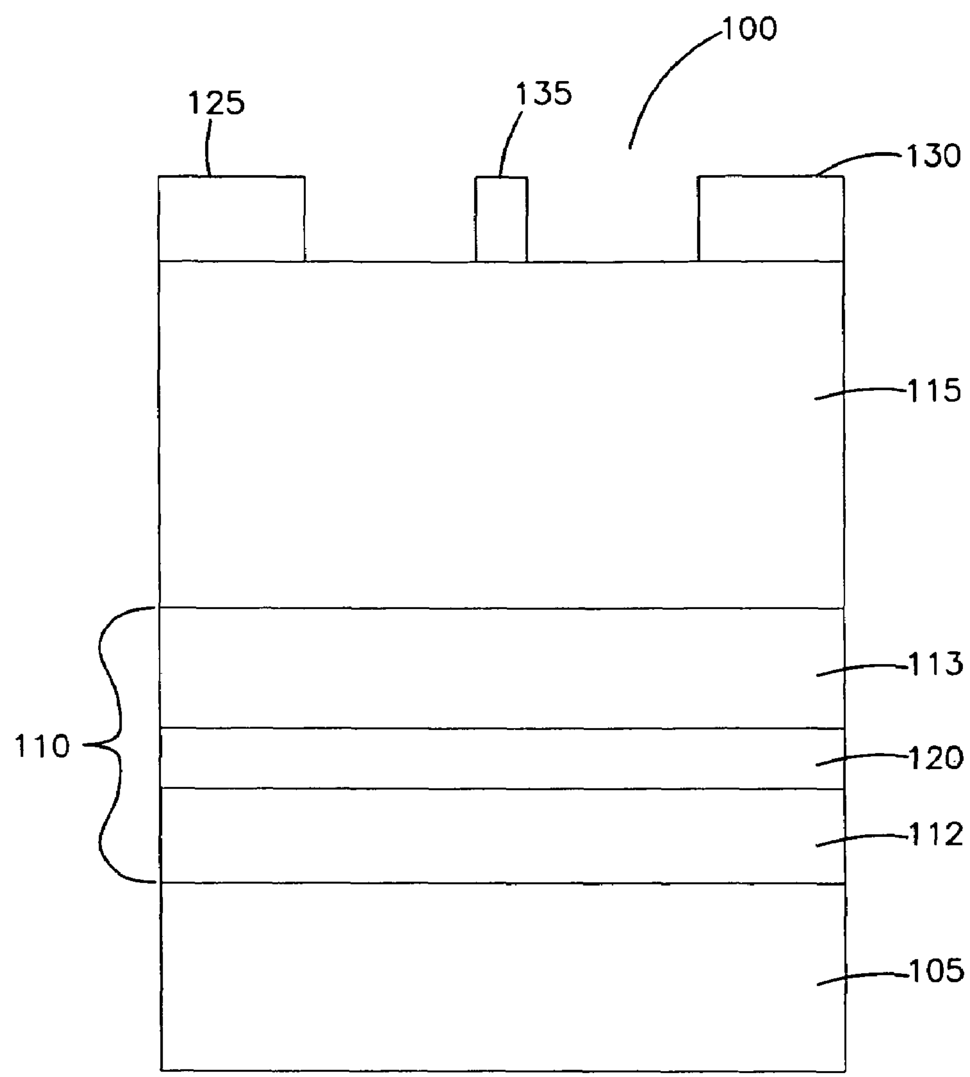
FIG. 1A depicts a device in accordance with one embodiment of the invention.

A device in accordance with the invention is configured to function as a heterojunction field effect transistor (HFET). FIG. 1 depicts one embodiment of a device in accordance with the invention. The device 100 comprises a substrate 105, a buffer region 110, a heterojunction region 115, and a superlattice 120. Generally, devices of the invention also include a source 125, a drain 130, and a gate 135 which are similar to those known to those of skill in the art as those commonly used in HFETs and will not be discussed at length herein.

The substrate 105 functions to provide a surface on which to build the device 100 of the invention and can also function to provide mechanical stability and strength to a device 100 of the invention, provide atomic registration for layers above the substrate 105, provide thermal conduction, or some combination thereof. Examples of materials that substrate 105 can be made of include, but are not limited to sapphire ($Al_2O_3$), silicon carbide (SiC), silicon (Si), gallium nitride (GaN), and aluminum nitride (AlN). In one embodiment of the invention, the substrate 105 is made of sapphire, or silicon carbide. Generally, the substrate 105 is from about 100 to 500 μm thick. In one embodiment, the substrate 105 is at least about 250 μm thick. The substrate 105 can have any crystal orientation. In an embodiment where the substrate 105 is made of SiC, the crystal orientation of the SiC can be a C plane, i.e. a (0 0 0 1) plane.

Positioned on top of the substrate 105 is the buffer region 110. Buffer region 110 serves as an intermediate structure between the substrate 105 and the heterojunction region 115 to create a smooth, insulating structure on which the heterojunction region 115 can be grown. The buffer region 110 is made up of a lower buffer region 112 and an upper buffer region 113, which are defined by the superlattice 120, which is spaced in between them.

The material of the buffer region 110 depends at least in part on the materials making up the heterojunction region 115 and may depend in part on the material of the substrate 105. In one embodiment, the buffer region 110 is made of one of the materials that comprise the heterojunction region 115. Examples of materials that buffer region 110 can be made of include, but are not limited to gallium nitride (GaN), aluminum gallium nitride (AlGaN), indium gallium nitride (InGaN), or mixtures thereof. In embodiments in which the buffer region 110 comprises both GaN and AlGaN for example, buffer region 110 generally comprises separate layers of the two materials. In another embodiment, the lower buffer region 112 comprises a layer of AlN.

Generally, the buffer region 110 spans about 0.5 to about 8.5 μm (this would include the superlattice 120). In another embodiment, the buffer region 110 is about 1.4 to about 2.1 μm thick. The thickness of the lower buffer region 112 is generally from about 0.1 to about 3 μm thick. In one embodiment, the lower buffer region 112 is from about 0.2 to about 1.5 μm thick In one embodiment, the lower buffer region 112 comprises one layer, positioned upon the substrate 105 that functions as a nucleation layer, and is generally made of AlN, and a second layer, positioned upon the AlN layer made of GaN. In an embodiment where the substrate 105 is made of silicon carbide, the layer of AlN is from about 100 to 2000 Å thick and the layer of GaN is from about 100 to about 5000 Å thick. In another embodiment, the AlN layer is about 1000 Å thick and the GaN layer is about 4000 Å thick.

The upper buffer region 113 is generally from about 0.3 to about 5 μm thick. In one embodiment, the upper buffer region 113 is from about 1 to about 1.5 μm thick. The independent thicknesses of the lower buffer region 112 and the upper buffer region 113 depend at least in part on the thickness of the superlattice 120, the material of the superlattice 120, and the material of the substrate 105. This interplay of factors is discussed with respect to the superlattice 120 below.

Positioned on top of the buffer region 110 is the heterojunction region 115. The heterojunction region 115 functions as the active portion of the device. The structure of the heterojunction region 115 allows the gate region 135 to control the flow of electrons from the source region 125 to the drain region 130. Generally speaking, the heterojunction region 115 is made of a multilayered structure of materials.

The materials that make up the layers of the heterojunction region 115 are configured to create a two dimensional electron gas channel through which current can flow from the source region 125 to the drain region 130. In one embodiment of the invention, the two dimensional electron gas channel is located at the junction of heterojunction region 115 and upper buffer region 113. In one embodiment, the two dimensional electron gas channel defines a volume wherein the probability of finding an electron decreases as you move perpendicular to the plane where the heterojunction region 115 and upper buffer region 113 meet.

Examples of materials that heterojunction region 115 can be made of include, but are not limited to, layers of AlN, and AlGaN, or InGaN and AlInGaN. The specific materials that make up the heterojunction region 115 depend at least in part on the desired carrier concentration, mobility, low field conductivity, transconductance and frequency response of the device. In one embodiment of the invention, the heterojunction region 115 is made of layers of GaN, AlN and AlGaN. One or more of the individual layers in the heterojunction region 115 can be doped or undoped. Whether or not the individual layers are doped or undoped is determined at least in part on the desired carrier concentration, mobility, low field conductivity, transconductance and frequency response of the device.

Positioned between the upper buffer region 113 and the lower buffer region 112 is the superlattice 120. Superlattice 120 generally functions to smooth the surface on which the heterojunction region 115 is grown. A smoother surface for the electrons to flow by increases the efficiency of the device 100. This increase in efficiency may occur by decreasing the electron scattering, improving the carrier mobility, or some combination thereof. The superlattice 120 may also function to deflect threading dislocations, that if too prominent in the structure of the device 100, can cause the electrons to scatter, which in turn decreases the efficiency of the device 100.

The superlattice 120 is made up of alternating layers of material. The material that makes up the superlattice 120 depends at least in part on the material of the heterojunction region 115, and/or the material of the buffer region 110. In one embodiment, where the heterojunction region 115 is made of alternating layers of AlGaN and AlN and the buffer region 110 is made of GaN and AlN, the superlattice 120 can be made of alternating layers of GaN, InGaN and/or AlGaN.

It is thought, but not relied upon, that the smoothing effect of the superlattice 120 is provided by the aluminum present in the layers. This effect, as well as the effect of deflecting threading dislocations can be controlled, at least in part, by at least four different factors: the amount of aluminum in the AlGaN layers of the superlattice 120, the distance of the superlattice 120 from the substrate 105, the number of layers that make up the superlattice 120, and the thickness of the individual layers of the superlattice 120.

In one embodiment, the superlattice 120 is positioned with respect to the interface of the substrate 105 and the buffer region 110 (i.e., close enough to the interface of the substrate 105 and the buffer region 110) such that dislocation densities are high enough to significantly disrupt any parasitic two dimensional electron gas formation. In one embodiment, dislocation densities of from about $10^{11}$ to $10^{9}$ $cm^{-2}$ can affect the desired level of disruption in the parasitic two dimensional electron gas formation.

In one embodiment, the superlattice 120 affects the lattice mismatch between the substrate 105 and the buffer region 110. The different layers of the device 100 are grown epitaxially. Epitaxially grown materials depend on the underlying substrate for atomic registration. Because the material of the substrate 105 is different than that of the heterojunction region 115, the interatomic spacing of the first layer grown on the substrate 105 and the first layer of the heterojunction region 115 will be incommensurate. This incommensurate interatomic spacing can result in the generation of periodic crystalline defects that function to compensate for those differences. Crystalline defects can also be referred to as threading dislocations. In one embodiment of the invention, the bilayers of the superlattice 120 function to deflect and/or diminish the threading dislocations so that they do not propagate up to the surface of the heterojunction region. In this way, a device of the invention that includes a superlattice 120 can function to decrease the parasitic conduction within the device.

The amount of aluminum can have an effect on the functionality of the superlattice 120. As the aluminum content is increased, the surface becomes smoother. However, higher aluminum contents can lead to the establishment of a parasitic parallel conduction path in the superlattice 120, which diminishes the efficiency of the device. Therefore, the upper limit of the amount of aluminum in the layers of the superlattice 120 is dictated, at least in part, by decreased device operating efficiencies at higher aluminum concentrations in the superlattice 120. The amount of aluminum in the AlGaN layers of the superlattice 120 is also dictated at least in part by the material of the substrate 105. The material of the substrate 105 plays a role in the composition of AlGaN layers because of the lattice mismatch between the material of the substrate 105 and the material of the lower buffer region 1112. Irrespective of the material of the substrate 105, the aluminum content, given by x in $Al_xGa_{1-x}N$ can range from about 0.01 to about 0.40. In another embodiment, the aluminum content, given by x in $Al_xGa_{1-x}N$ can range from about 0.02 to about 0.30. In an embodiment where the substrate 105 is made of sapphire, the aluminum content, given by x in $Al_xGa_{1-x}N$ is about 0.28. In an embodiment where the substrate 105 is made of silicon carbide, the aluminum content, given by x in $Al_xGa_{1-x}N$ is about 0.02.

In another embodiment of the invention, the amount of aluminum in the different layers of the superlattice 120 can be different. Differing amounts of aluminum in the layers of the superlattice 120 can cause a strain effect between the layers. This strain can further deflect the threading dislocations that lead to parasitic conduction. Furthermore, differing amounts of aluminum in the layers of the superlattice 120 may allow more precise control of the tradeoff between the smoothing effects of aluminum and the electron leakage that it can cause. For example, by having less aluminum in the lower layers than the upper layers of the superlattice 120, the lower layers could be significantly smoother, while the upper layers could benefit from the smoothness below them, but not be subject to the same electron leakage effects of the lower layers.

Another characteristic of the superlattice 120 that can control the effects thereof is the distance of the superlattice 120 from both the substrate 105 and the heterojunction region 115. As the superlattice 120 gets closer to the substrate 105, it becomes less likely that the superlattice 120 can overcome the defects that are caused by the lattice mismatch between the substrate 105 and the layer that is directly above it, i.e. the lower buffer region 112, in FIG. 1. However, as the superlattice 120 gets closer to the heterojunction region 115 parasitic conduction in the superlattice 120 counteracts any advantages that the smoothing may have caused. The distance that the superlattice 120 is from the substrate 105 is also dictated at least in part by the material of the substrate 105. It is contemplated that the lower buffer region 112 is not present, and the superlattice 120 is positioned directly upon the substrate 10S. In one embodiment, the lower buffer region 112 is about 0 to about 3.2 μm thick, in yet another embodiment, the lower buffer region is about 0.4 to about 0.5 μm thick.

Another characteristic of the superlattice 120 that can control its effects is the number of layers or periods that make up the superlattice 120. A layer or period, as used with respect to the superlattice 120, refers to one pair of AlGaN and GaN layers. As the number of layers of the superlattice 120 is increased, the smoothing effect will also be increased. In one embodiment of the invention, the superlattice 120 can be made of about 2 to 500 individual layers of material. In another embodiment, the superlattice 120 can be made of about 4 to 50 individual layers of material. In yet another embodiment, the superlattice 120 can be made of about 10 individual layers (5 pairs).

Yet another characteristic of the superlattice 120 that can control its effects is the thickness of the individual layers. The thickness of the layers is controlled on the upper end by the formation of parasitic electron channels at thicknesses greater than about 200 Å. The lower limit of the thickness is controlled at least in part by interatomic spacing. The lower limit may also be controlled at least in part by the number of atomic layers that it takes to obtain a smooth surface. In one embodiment, this may mean that the layers have to be at least about 2 Å thick in order to provide the desired smoothing effect. However, there also may be some benefit to an individual layer of the superlattice 120 that is made of a partial atomic layer. The individual layers within the superlattice 120 can also have different thicknesses, for example, in one embodiment made up of alternating layers of AlGaN and GaN, the AlGaN layers have a thickness of about 100 Å, and the GaN layers have a thickness of about 80 Å. In another embodiment, individual AlGaN or GaN layers can have different thicknesses than other AlGaN or GaN layers. The AlGaN thickness in the superlattice can be up to 1000 Angstroms.

Embodiments of the invention may also contain more than one superlattice 120 within the buffer region 110.

FIGS. 1B through 1H depict an exemplary method of fabricating a device of the invention. It should be understood that the exemplary methods of fabricating the device that are provided herein are only exemplary and are not meant to limit the invention in any way. It should also be understood that parameters such as flow rates, growth time, and temperature could be varied depending on the reactor geometry, reactor size, reactor type, and other factors. Therefore, all values of flow rates, growth times, and other parameters provided herein are provided with respect to their use in a 1.25" diameter vertical reactor. It should also be understood that flow rates provided herein represent flow rates through the metalorganic bubbler and do not represent actual metalorganic flows (flow rates may be dependent on carrier gas flow, bubbler temperature, and head pressure, for example).

Figure 1B:
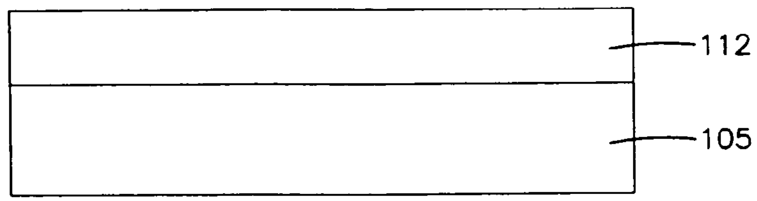
FIGS. 1B through 1H depict an exemplary method of fabricating a device in accordance with the invention.

FIG. 1B depicts the first step, the formation of the lower buffer region 112 on the substrate 105. The lower buffer region 112 can be formed by a number of different methods, including but not limited to molecular beam epitaxy (MBE), chemical beam epitaxy (CBE), plasma enhanced MBE, plasma enhanced chemical vapor deposition (PECVD), atomic layer epitaxy (ALE), vapor phase epitaxy (VPE), and low pressure metalorganic chemical vapor deposition (MOCVD). In a method utilizing MOCVD, temperatures of growth can range from about 500 to about 1200° C., pressures from about 10 Torr to atmospheric pressures, and growth times from about 30 minutes to about 5 hours. In embodiments where the lower buffer region 112 comprises more than one layer, the growth of the entire layer can generally be accomplished in about 30 minutes to about 5 hours, however, the growth times of the individual layers can vary from times as short as one second or less.

In an embodiment where the lower buffer region 112 comprises an AlN layer that functions as a nucleation region examples of precursors include, but are not limited to triethylaluminum, ammonia, trimethylaluminum, trimethylamine alane, activated (atomic) nitrogen, and hydrazine. The flow rate for triethylaluminum can range from about 0.01 microgram/min to about 1 gram/min. The flow rate for ammonia can range from about 100 sccm to about 20 slm, with the same considerations applying (i.e., reactor size, reactor geometry, and the desired growth rate). Alternatively, one embodiment provides the precursors at a rate that provides a growth rate of from about 0.01 microns/hour to about 10 microns/hour. In embodiments where lower buffer region 112 has additional layers, such as a layer of GaN, it can be grown similarly, depending on its composition and thickness.

Figure 1C:
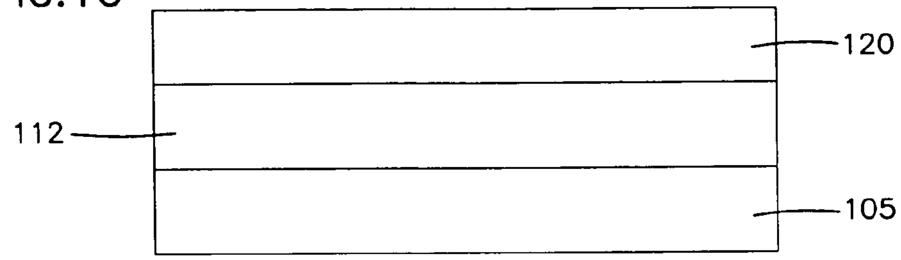

FIG. 1C depicts the formation of the superlattice 120 on the lower buffer region 112. The superlattice 120 is formed by forming each individual layer of the superlattice 120 separately, in one embodiment, each individual layer of GaN and $Al_xGa_{1-x}N$ separately. The individual layers of the superlattice 120 can be formed by a number of different methods, including but not limited to molecular beam epitaxy (MBE), chemical beam epitaxy (CBE), plasma enhanced MBE, plasma enhanced chemical vapor deposition (PECVD), atomic layer epitaxy (ALE), vapor phase epitaxy (VPE), and low pressure metalorganic chemical vapor deposition (MOCVD).

In a method utilizing MOCVD, temperatures of growth can range from about 500 to about 1200° C., pressures from about 10 Torr to atmospheric pressures. The time for growing each individual layer of the superlattice 120 depends at least in part on the desired thickness of the layer. Generally, growth times for the GaN layers is from about 1 sec to about 5 hours, and growth times for the $Al_xGa_{1-x}N$ layers is from about 1 sec to about 1 hour. Examples of precursors that can be used for GaN and $Al_xGa_{1-x}N$ respectively include, but are not limited to triethylgallium, trimethylgallium, and hydrazine, ammonia and trimethylaluminum, triethylaluminum, trimethylgallium, triethylgallium, hydrazine, ammonia, and trimethyl amine alane.

The flow rates, which would depend at least in part on the composition of the material, include for example, triethylgallium a rate of about 0.01 grams/hour to about 10 grams/hour, triethylaluminum at a rate of about 0.0001 micrograms/hour to about 1 grams/hour, and for ammonia from about 10 sccm to about 50 slm. In one embodiment, the precursors are provided at a rate that provides a growth rate of from about 0.01 microns/hour to about 10 microns/hour.

In one embodiment, the individual layers of the superlattice 120 are grown by the following exemplary MOCVD method. The structure, including the substrate 120, and lower buffer region 112 are grown in an inductively heated single 1.25" diameter wafer vertical reactor. The pressure is stabilized at about 76 Torr, the chamber cooling water is turned on, the filament is turned on and maintained for about 10 minutes. The rotation of the structure is turned on, and the RF power is turned on. The temperature is heated and stabilized at about 1000° C. A hydrogen flow of about 1.2 slm (standard liters per minute) and a $NH_3$ flow of about 1.5 slm are maintained. The flow of hydrogen through the triethylgallium bubbler is decreased from 40 sccm (standard cubic centimeters per minute) to 10 sccm over a 30 second period of time. During this time, the first GaN layer will be grown. After 30 seconds, the triethylaluminum hydrogen carrier gas flow of 100 sccm is turned on for 90 seconds to grow the first $Al_xGa_{1-x}$ layer. Every 90 seconds, the triethylaluminum is turned off to form the alternating layers of GaN, after which the triethylaluminum is turned on and the next $Al_xGa_{1-x}N$ layer is formed. This switching on and off of the triethylaluminum is used to form the alternating GaN/$Al_xGa_{1-x}N$ layers.

Figure 1D:
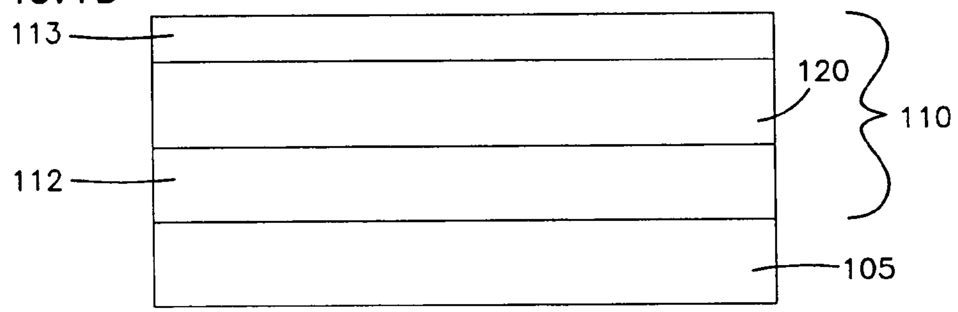

FIG. 1D depicts the next step in the fabrication of a device of the invention, the formation of the upper buffer region 113 on the superlattice 120. The upper buffer region 113 can be formed by a number of different methods, including but not limited to molecular beam epitaxy (MBE), chemical beam epitaxy (CBE), plasma enhanced MBE, plasma enhanced chemical vapor deposition (PECVD), atomic layer epitaxy (ALE), vapor phase epitaxy (VPE), and low pressure metalorganic chemical vapor deposition (MOCVD). In a method utilizing MOCVD, temperatures of growth can range from about 500 to about 1200° C., pressures from about 10 Torr to atmospheric pressures, and growth times from about 30 minutes to about 5 hours. In an embodiment where the upper buffer region 113 comprises GaN, examples of precursors include, but are not limited to triethylgallium and ammonia. The flow rate for triethylgallium can range from about 0.01 grams/hour to about 10 grams/hour. The flow rate for ammonia can range from about 10 sccm to about 50 slm. In embodiments where upper buffer region 113 has additional layers, they can be grown similarly, depending on their composition and thicknesses. It should be understood that flow rates are dependent on reactor size, reactor geometry, and the desired growth rate, and should in no way be construed as limiting the scope of the invention. In one embodiment, the precursors are provided at a rate that provides a growth rate of from about 0.01 microns/hour to about 10 microns/hour.

Figure 1E:
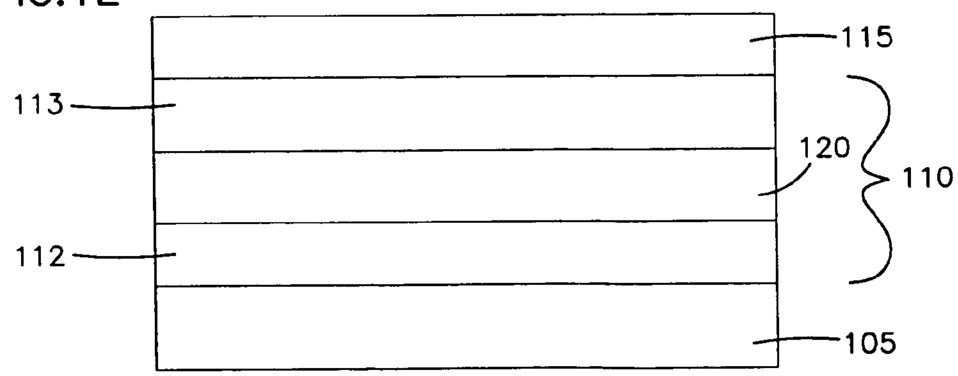

FIG. 1E depicts the next step in an exemplary fabrication of the device, formation of the heterojunction region 115 on the upper buffer region 113. The heterojunction region 115 is formed by forming each individual layer of the heterojunction region 115 separately. In some embodiments of the invention, some of the individual layers that make up the heterojunction region 115 can also be doped. The individual layers of the superlattice 120 can be formed by a number of different methods, including but not limited to molecular beam epitaxy (MBE), chemical beam epitaxy (CBE), plasma enhanced MBE, plasma enhanced chemical vapor deposition (PECVD), atomic layer epitaxy (ALE), vapor phase epitaxy (VPE), and low pressure metalorganic chemical vapor deposition (MOCVD). In a method utilizing MOCVD, temperatures of growth can range from about 500 to about 1200° C., pressures from about 10 Torr to atmospheric pressures.

The time for growing each individual layer of the heterojunction region 115 depends at least in part on the desired thickness of the layer. Generally, growth times for AlN layers is from about 0.0001 grams/hour to about 1 gram/hour, and growth times for the $Al_xGa_{1-x}N$ layers is from about 5 seconds to about 1 hour.

Examples of precursors that can be used for AlN and $Al_xGa_{1-x}N$ include, but are not limited to trimethylaluminum, trimethylaminealane, tri-isobutylaluminum, triethylaluminum, trimethylgallium, triethylgallium, hydrazine, ammonia, and activated (atomic) nitrogen. The flow rates, which would depend at least in part on the composition of the material and reactor size and design, include for example, triethylgallium at a rate of about 0.01 g/hour to about 10 grams/hour, triethylaluminum at a rate of about 0.0001 g/hour to about 1 g/hour, and ammonia at a rate of from about 10 sccm to about 50 slm. In embodiments that include a doped layer, dilute disilane, or dilute silane can be used as a dopant. In such embodiments, the concentration of disilane is about 10 ppb to about 50%, and the flow is about 1 sccm to about 1 slm (of doped solution). In one embodiment, the precursors are provided at a rate that provides a growth rate of from about 0.01 microns/hour to about 10 microns/hour.

Figure 1F:
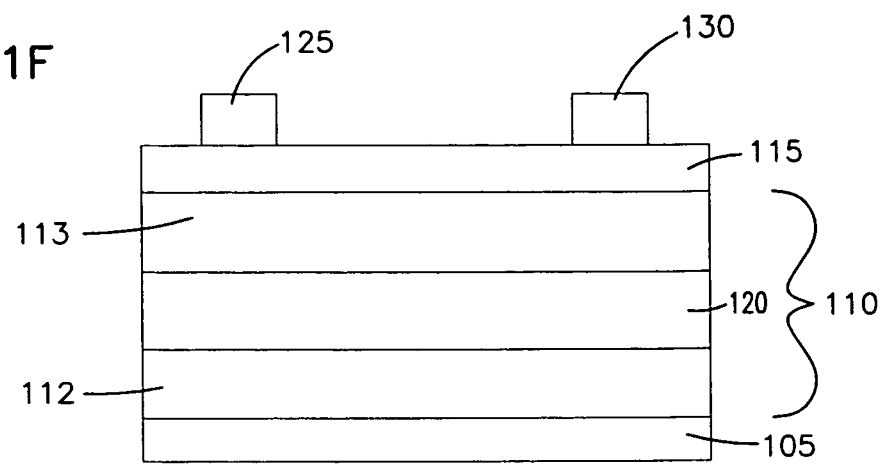

FIG. 1F depicts the next step in this exemplary method of fabrication, the formation of the source region 125 metal contacts and the drain region 130 metal contacts. This can generally be accomplished with photolithography processes, and e-beam metal deposition methods for example. The materials of the source region 125 and the drain region 130 are generally annealed after formation.

Figure 1G:
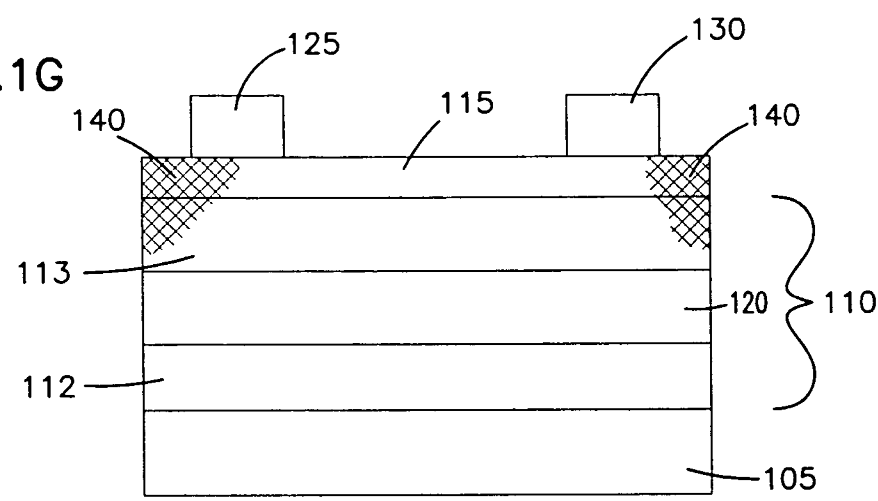

FIG. 1G depicts the next step in this exemplary method of fabrication, the formation of the ion implantation regions 140. Ion implantation sufficient to yield device isolation is used here. Typical doses of implant species run from $10^{12}$ $cm^{-2}$ to $10^{16}$ $cm^{-2}$ with energies running from 5 keV to 200 keV. The implant species include, but are not limited to helium, proton, nitrogen, argon. Alternatively, device isolation can be accomplished using mesa etch isolation. In such an embodiment, the conductive layer around the device is selectively removed by a reactive ion etch (RIE). Methods of isolating devices using mesa etch isolation are well know to those of skill in the art.

Figure 1H:
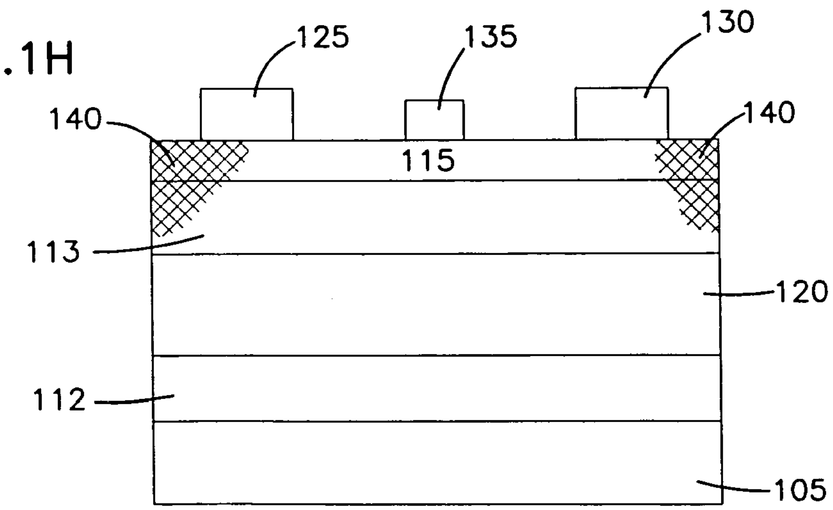

FIG. 1H depicts the next step in an exemplary process of fabrication, the formation of the gate region 135. This can generally be accomplished with photolithography processes, e-beam lithography, and e-beam metal deposition methods for example.

Figure 2:
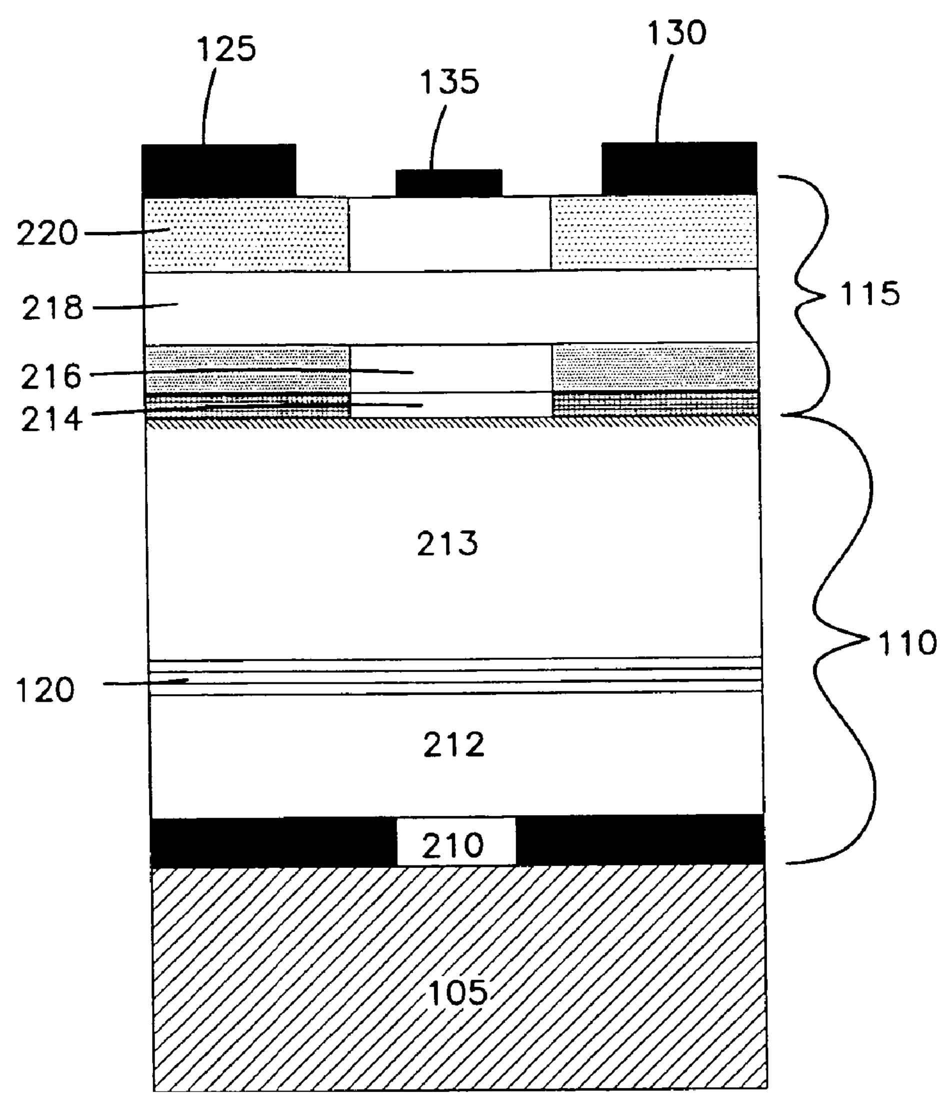
FIG. 2 depicts a device in accordance with another embodiment of the invention.

FIG. 2 depicts another embodiment of a device 200 in accordance with the invention that offers an alternative structure for heterojunction region 115. In this embodiment, heterojunction region 115 is made up of first layer 214, second layer 216, third layer 218, and fourth layer 220. In one embodiment, first layer 214 is made of AlN and has a thickness of about 5-15 Å, second layer 216 is made of $Al_zGa_{1-z}N$ where z is from about 0.1 to 1, third layer 218 is made of n doped (e.g. silicon) $Al_xGa_{1-x}N$ where x is from about 0.1 to about 0.5, and fourth layer 220 is made of $Al_yGa_{1-y}N$, where y is from about 0 to 0.5. In another embodiment, third layer 218 is undoped. These configurations represent embodiments that allow the gate 135 to control current flow from source 125 to drain 130 through the heterojunction region 115. In other embodiments, first layer 214 need not be present in a device of the invention. If first layer 214 is present, it can, but need not be in accordance with U.S. Pat. Nos. 5,296,395 and/or 5,192,987, the disclosure of which are incorporated herein by reference.

Figure 3:
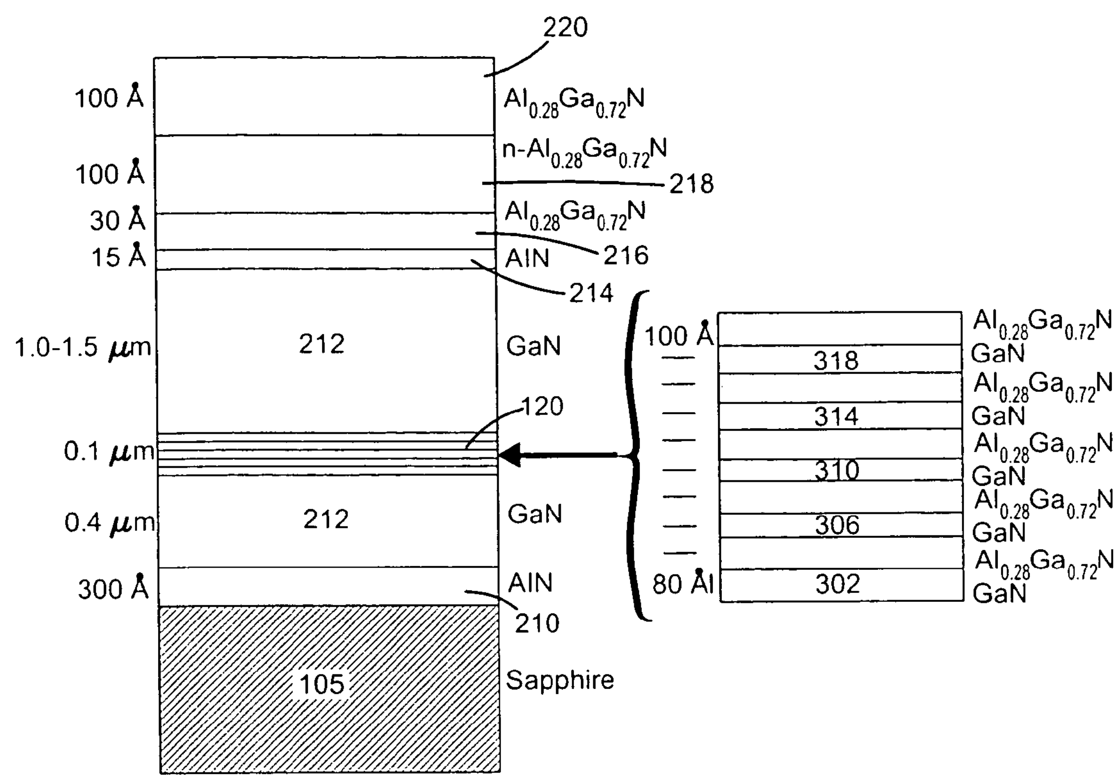
FIG. 3 depicts a device in accordance with yet another embodiment of the invention.
Figure 4:
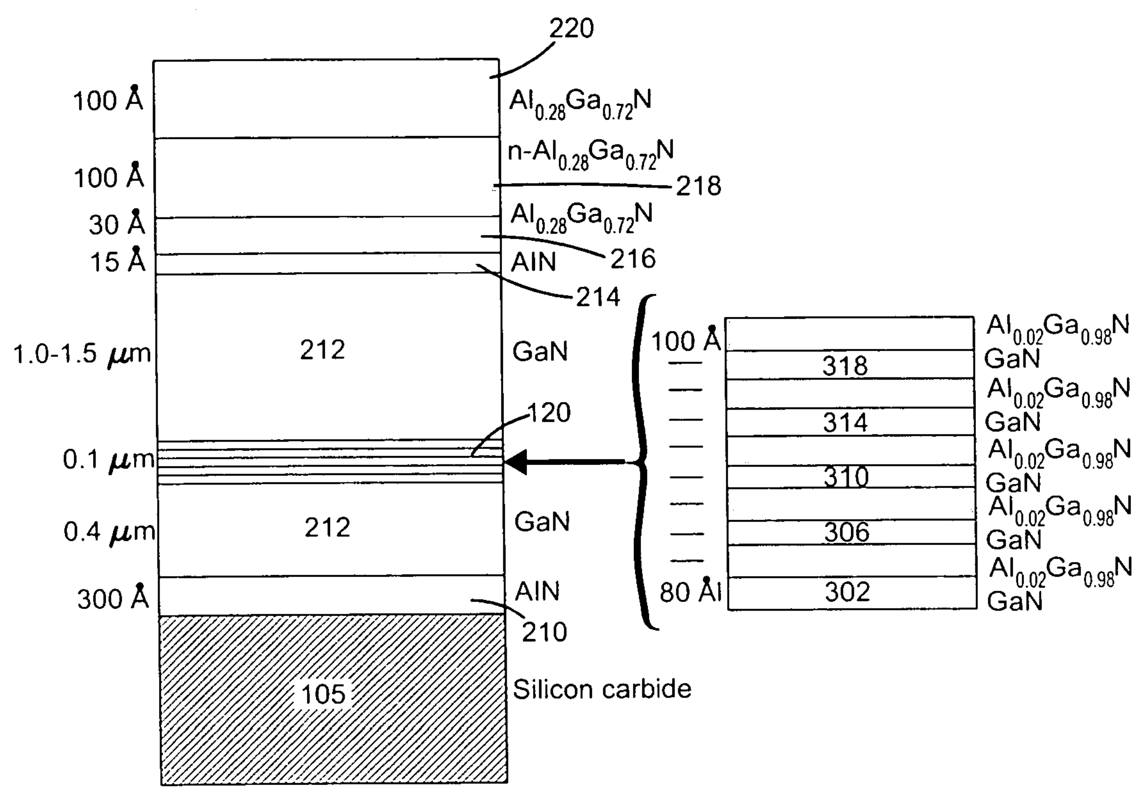
FIG. 4 depicts a device in accordance with a further embodiment of the invention.

FIG. 3 depicts yet another embodiment of the invention. This embodiment includes a substrate 105 that is made of sapphire, and has the thicknesses and materials as seen there. FIG. 4 depicts a further embodiment of the invention. This embodiment includes a substrate 105 that is made of silicon carbide and has the thicknesses and materials as seen there.

Figure 5:
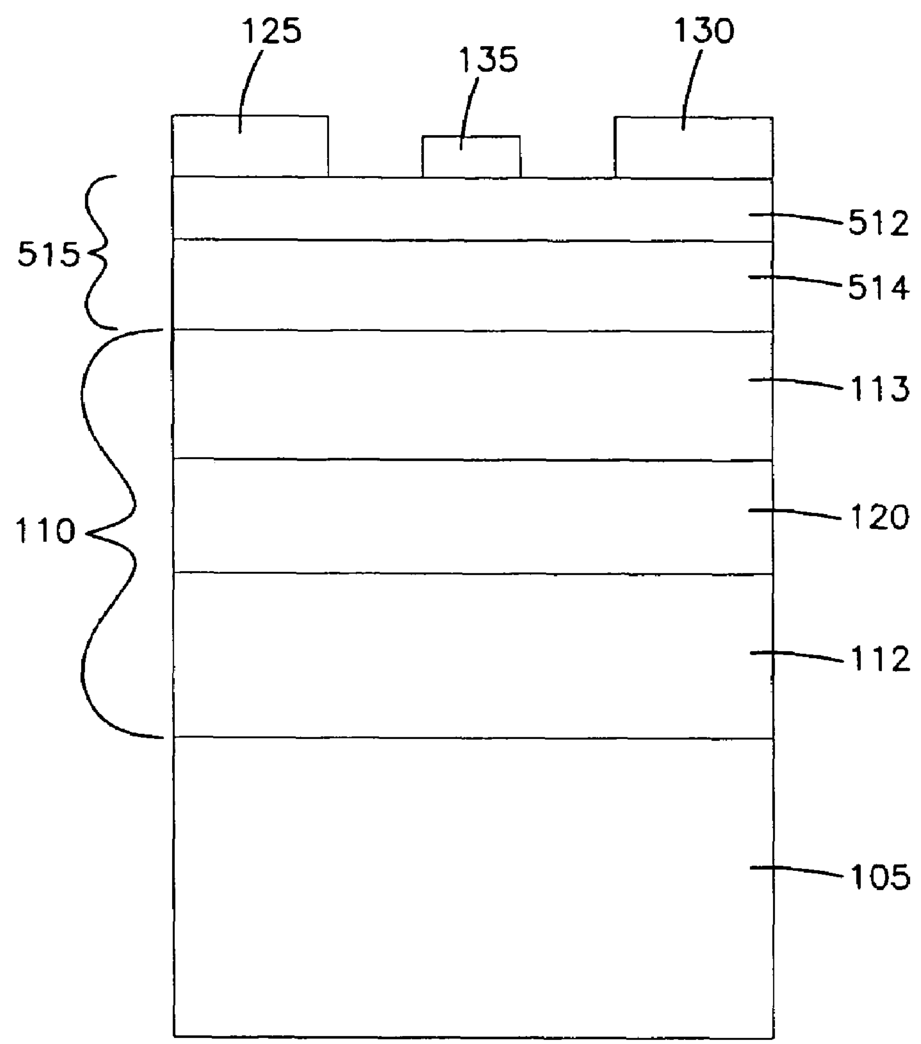
FIG. 5 depicts a device in accordance with a further embodiment of the invention.

FIG. 5 depicts another embodiment of a heterojunction 515 of a device in accordance with the invention. The heterojunction region 515 in this embodiment is depicted within the device 500. The remaining portions of device 500 can be the same as that of other embodiments of the device, and are numbered accordingly. These similar structures will not be discussed in detail herein. In this embodiment, heterojunction region 515 includes first layer 512 and second layer 514. First layer 512, is positioned directly below the source 125, drain 130 and gate 135. Second layer 514 is positioned directly below first layer 512 and directly above upper buffer region 113.

In this embodiment, first layer 512 is made of $Al_yGa_{1-y}N$, where y has a value of from about 0.1 to about 1. In another embodiment, y has a value of about 0.3. In this embodiment, second layer 514 is made of $Al_yGa_{1-y}N$, where y has a value of from about 0.1 to about 1. In another embodiment y has a value of about 1. In this embodiment, first layer 512 is doped, and second layer 514 is undoped.

In this embodiment depicted in FIG. 5, first layer 512 of the heterojunction 515 has a thickness of from about 100 to about 300 Å. In another embodiment, the first layer 512 has a thickness of about 200 Å. In this embodiment, second layer 514 has a thickness of from about 2 to about 30 Å. In another embodiment, the second layer 514 has a thickness of about 10 Å.

Figure 6:
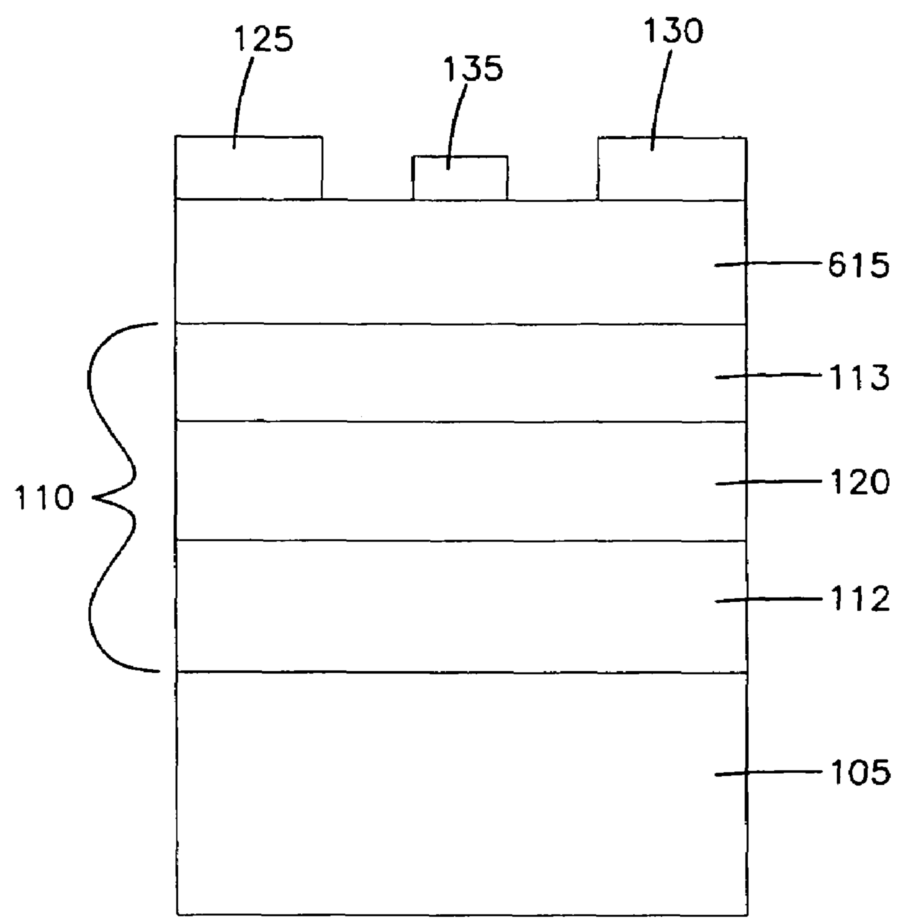
FIG. 6 depicts a device in accordance with a further embodiment of the invention.

In another embodiment depicted in FIG. 6, the heterojunction region 615 is made of $Al_bGa_{1-b}N$, where b has a value of from about 0.1 to about 1. In another embodiment, b has a value of about 0.3. In this embodiment, the $Al_bGa_{1-b}N$ is pulse doped. Pulse doping of the $Al_bGa_{1-b}N$ layer generally results in a trilayer structure. A layer can be pulse doped by stopping or interrupting growth of $Al_bGa_{1-b}N$, and only admitting dopant (such as disilane) along with the nitrogen source (ammonia for example). After some period of time, about 5 seconds to 5 minutes, the disilane is stopped and growth of $Al_bGa_{1-b}N$ is resumed. In one embodiment, this can result in a structure that has about a 100 to 300 Å later of undoped $Al_bGa_{1-b}N$, on top of about an atomic layer (i.e., about 2 to 10 Å thick) of dopant, which is on top of an undoped layer of $Al_bGa_{1-b}N$ that is about 2 to 50 Å thick. Any method of pulse doping that is commonly used by those of skill in the art can be utilized to create the heterojunction region 615 in this embodiment.

WORKING EXAMPLES

The invention will be further illustrated through the following examples.

Working Example 1

A device in accordance with the invention was fabricated as follows.

A degreased and etched (0001) basal plane sapphire substrate (1.25 inch diameter) was loaded on the SiC-coated graphite susceptor of a low-pressure metalorganic chemical vapor deposition (LP-MOCVD) vertical reactor with an inductive RF heater. All growth steps were carried out at 76 Torr using triethyl gallium at a flux of about 2 mg/min, triethyl aluminum at a flow of about 100 μg/min, ammonia at a flow of about 1.5 sl/min, and dilute disilane where necessary.

A conventional low-temperature (640° C.) buffer layer of AlN of about 300 Å was grown (growth time of about 5 minutes) was followed by high-temperature (~1000° C.) undoped GaN (0.5 μm grown for about 20 minutes). Next, the superlattice of 5 periods (10 layers) of alternating layers of $Al_{0.02}Ga_{0.98}N$/GaN (0.1 μm) was deposited without any growth interruption at about 1000° C. Each GaN layer was about 80 Å thick (growth time about 1 minute 30 seconds) and each $Al_{0.02}Ga_{0.98}N$ layer was about 100 Å thick (growth time about 1 minute 30 seconds). After the superlattice was deposited, an additional undoped GaN layer of about 1.0 μm was grown (growth time about 50 minutes). Next, AlN/$Al_{0.28}Ga_{0.72}N$ spacer layers of about 10 Å and about 30 Å respectively were grown (growth time about 30 seconds each). Finally, a silicon doped ($3\times10^{18}$ $cm^{-3}$) $Al_{0.28}Ga_{0.72}N$ layer of about 200 Å were grown (growth time about 3 minutes 30 seconds).

Working Example 2

The device fabricated in Example 1 was then evaluated as follows.

Several techniques were employed to evaluate the structure including differential interference contrast (DIC) (Nomarski) microscopy, room temperature van der Pauw Hall measurements, high resolution x-ray diffraction (HRXRD), scanning electron microscopy (SEM) with selective etching, atomic force microscopy (AFM), and depletion capacitance-voltage depth profiling.

All growths showed mirror like flatness when examined using DIC microscopy (results not shown). The mobility and carrier concentration were measured by van der Pauw Hall technique immediately after growth.

Room temperature Hall effect measurements were made using van der Pauw technique. An increase of 2-DEG mobility from 1200 $cm^2$/V s (without superlattice) to 1500 $cm^2$/V s (with superlattice) was obtained with an increase in the carrier density from 1.1 to $1.4\times10^{13}$ $cm^{-2}$. The trend likely reflects changes in the planarity of the heterointerface and the reduction in threading dislocation density.

High resolution XRD measurements were performed using a five crystal high resolution x-ray diffractometer. The effect of the threading dislocations on the x-ray diffraction peak in epitaxial GaN films was evaluated in both angular (ω scans) and a radial scans (ω-2θ scans) in a series of symmetric and asymmetric reflections.

Figure 7:
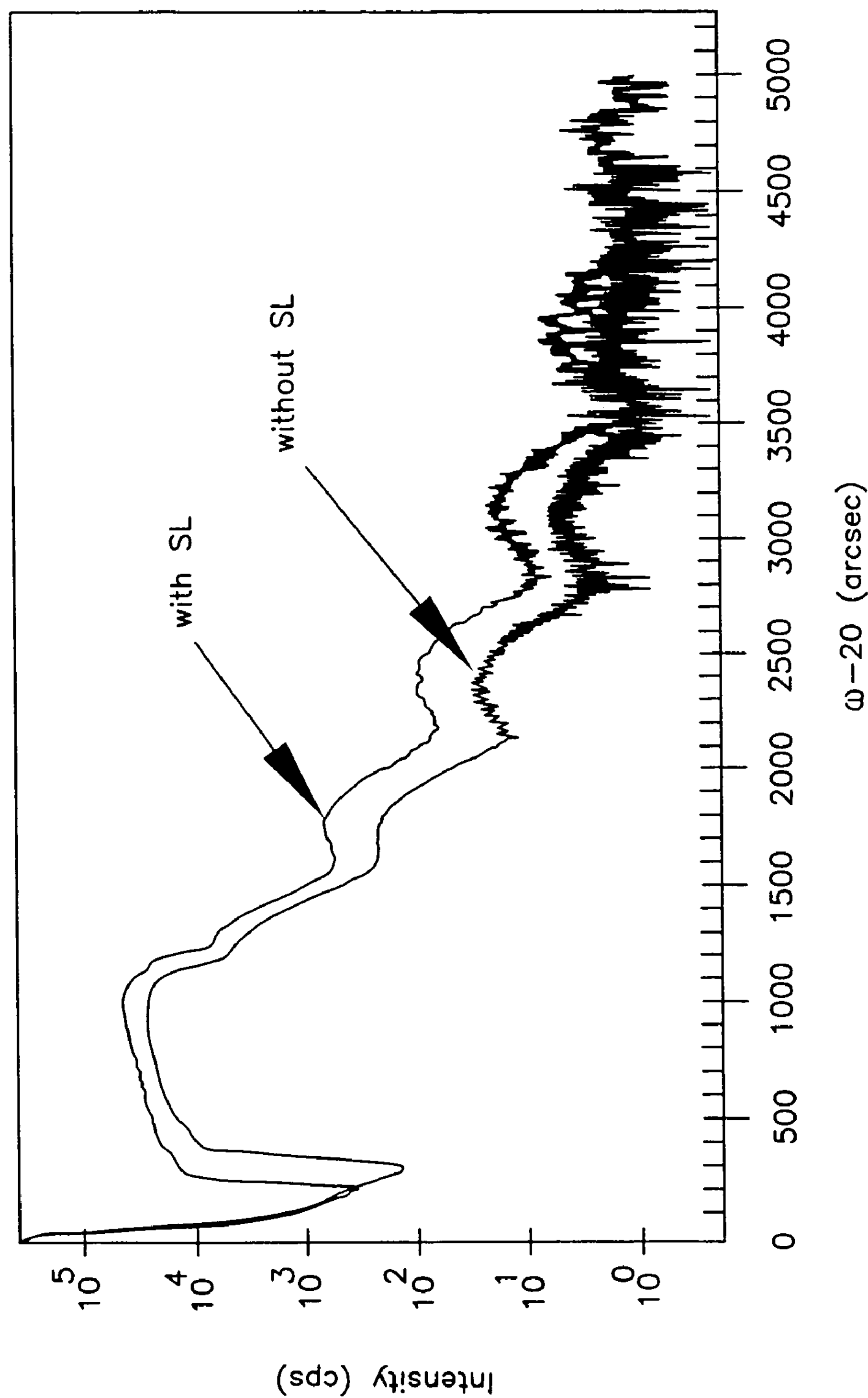
FIG. 7 depicts grazing incidence X-ray reflectivity (GIXRR) data from a device in accordance with the invention ("with SL" in FIG. 5) and a device not in accordance with the invention ("without SL" in FIG. 5).

FIG. 7 shows the measured grazing incidence X-ray reflectivity (GIXRR) data from samples with and without the superlattice (referred to as SL in FIG. 7). Values of layer thickness, interface roughness and electron density have been extracted from the reflectivity curve using a modeling method which is built around first principles, Maxwell's equations, and generic fitting algorithms. The GaN layer was assumed to be the effective substrate due to the limited penetration depth of the GIXRR method. For the Al concentration of $Al_xGa_{1-x}N$ a value of x=25% was used as calculated from the peak separation of the ω-2θ scans (see FIG. 8).

A comparison between the samples indicates that the thickness of the $Al_{0.25}Ga_{0.75}N$ layers is very similar between the samples. The main differences relate to the level of interface roughness. The device with the superlattice has sharper interfaces than the device without the superlattice.

TABLE 1

Parameters extracted from XRR measurements.

| Layer | Thickness (Å) no SL | Thickness (Å) SL | Roughness (Å) no SL | Roughness (Å) SL | Density (%) no SL | Density (%) SL |
|---|---|---|---|---|---|---|
| Extra top layer (damage, oxide, etc.) | 1.0 (fixed) | | 5.51 | 9.92 | 24.86 | 36.64 |
| $Al_{0.25}Ga_{0.75}N$ | 193.78 | 195.76 | 19.98 | 11.73 | 100.0 | 99.98 |
| AlN | 5.70 | 6.74 | 11.32 | 6.56 | 85.7 | 99.26 |
| GaN | ∞ | | 15.75 | 9.70 | 100 (fixed) | |

Figure 8A:
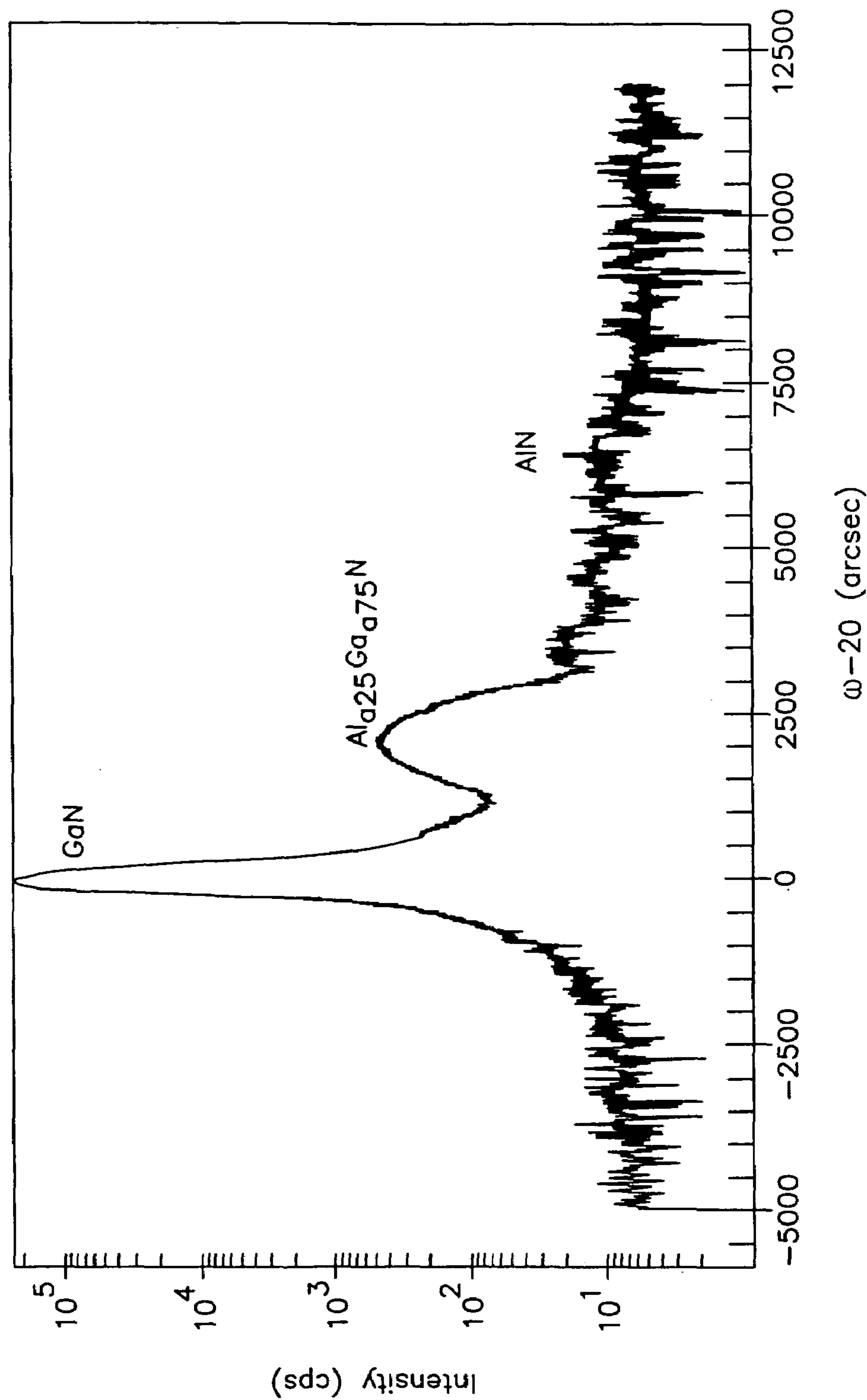
FIGS. 8*a* and *b* show the ω-2θ measurements on the (004) reflection of a device not in accordance with the invention (a) and a device in accordance with the invention (b).
Figure 8B:
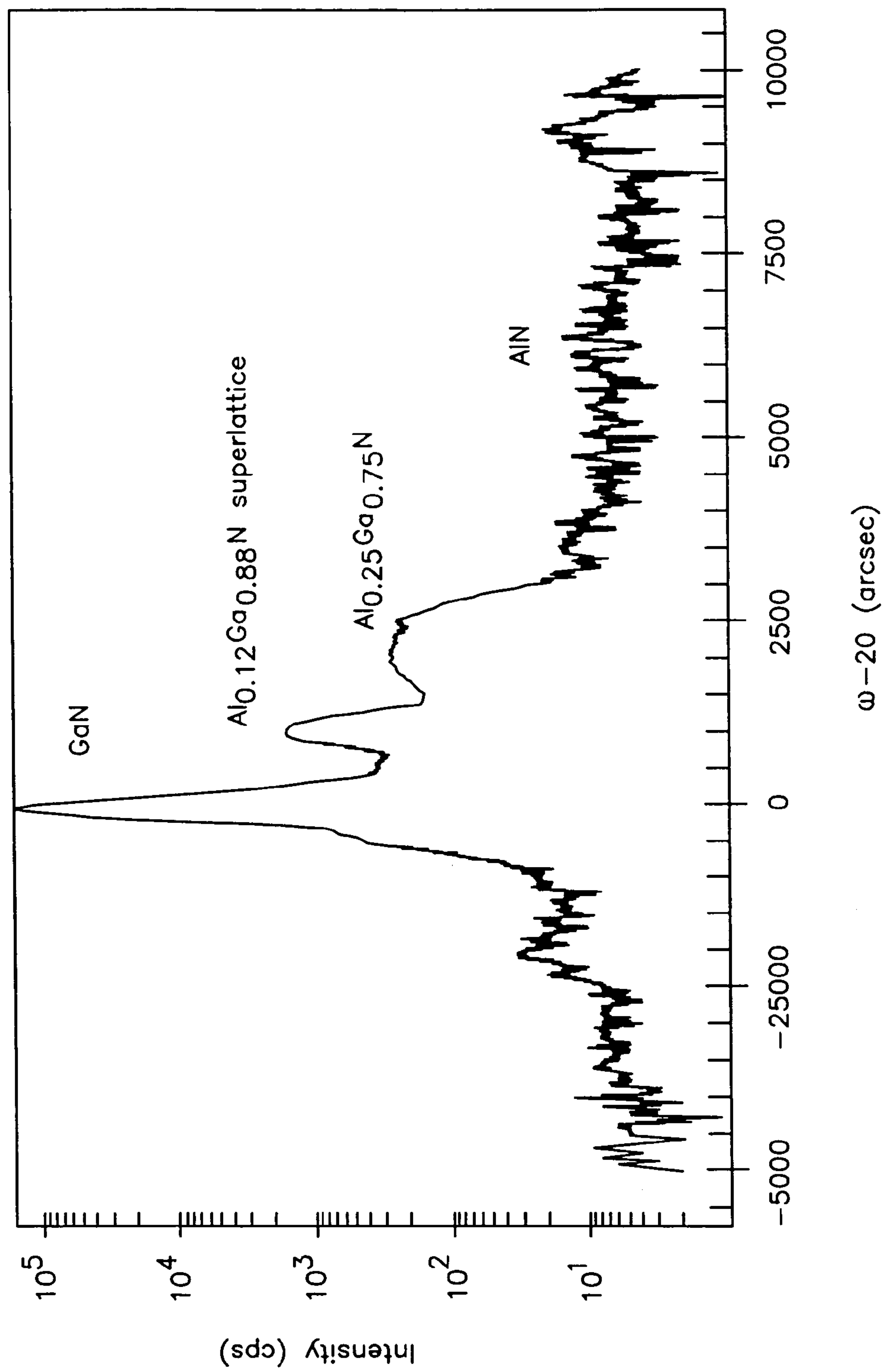

FIG. 8 shows the ω-2θ scans on the (004) reflection. The GaN and $Al_xGa_{1-x}N$ peaks displacement provides a very precise measure of relaxation and layers composition within multilayer structure.

Figure 9:
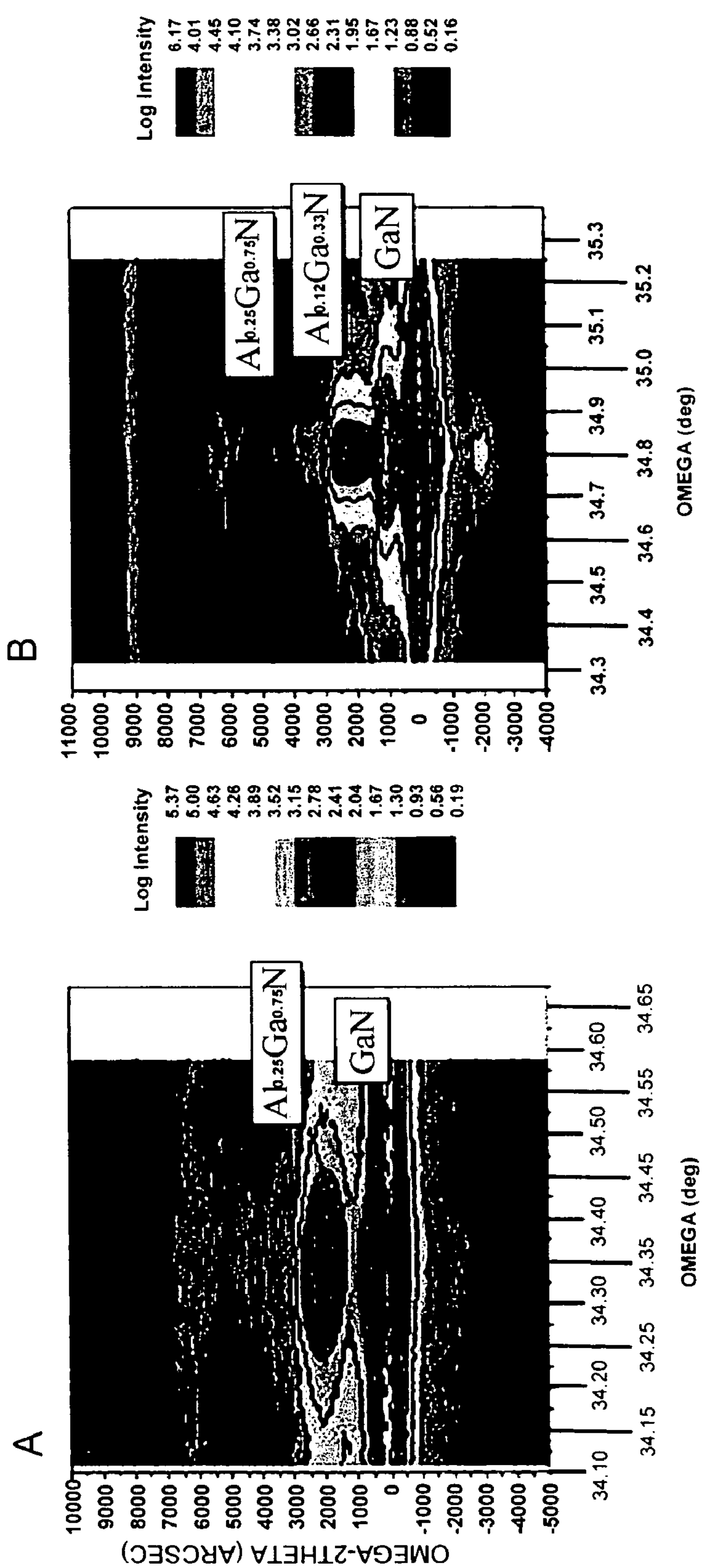
FIGS. 9*a* and *b* show reciprocal space maps of out of plane asymmetric x-ray reflections of a device in accordance with the invention (a) and a device not in accordance with the invention (b).

Reciprocal space maps (RSMs), utilizing high-resolution x-ray optics, provide the definitive measurement of all the structural crystallographic phenomena occurring within a multilayer sample. Reciprocal space maps visually display any changes in the crystal lattice parameter along the ω-2θ direction with effects of orientation (disorder) along the ω axis. In the two reciprocal space maps shown in FIG. 9, of samples with (FIG. 9*b*) and without (FIG. 9*a*) a superlattice significant differences are seen. The solid wedge image shown in the sample without superlattice indicates that the surface roughness must be uncorrelated and is without a well-defined average interface. Whereas, the 'V' shape in the sample with SL requires a well defined average interface with correlated or partially correlated roughness.

The Williamson-Hall plots were then used to compare the dislocation densities for HFET samples in both angular (ω scans) and a radial scans (ω-2θ scans) in a series of ϕ scans in series of asymmetric in plane and out of plane (104), (115), (105) reflection.

The out of plane, asymmetric measurements show that the edge dislocation density for the sample without a superlattice is higher than the dislocation density for the sample with superlattice. The asymmetric out of plane measurements confirm that the sample with a superlattice is a higher quality than the sample without a superlattice with an order of magnitude lower densities along specific in-plane directions.

TABLE 2

Analysis summary of XRD measurements

| Scans Parameters | no SL | SL |
|---|---|---|
| Asymmetric out of plane peaks ω scans (H0L) family of reflections: (102), (103), (104), (105) | | |
| Edge dislocation density, $N_E$ ($cm^{-2}$): | $6.53\times10^8$ | $4.69\times10^7$ |
| Asymmetric in plane peaks ϕ scans (HKL) family of reflections: (104), (115), (105) | | |
| Edge dislocation density, $N_E$ ($cm^{-2}$): | $8.51\times10^9$ | $6.85\times10^8$ |

Figure 10:
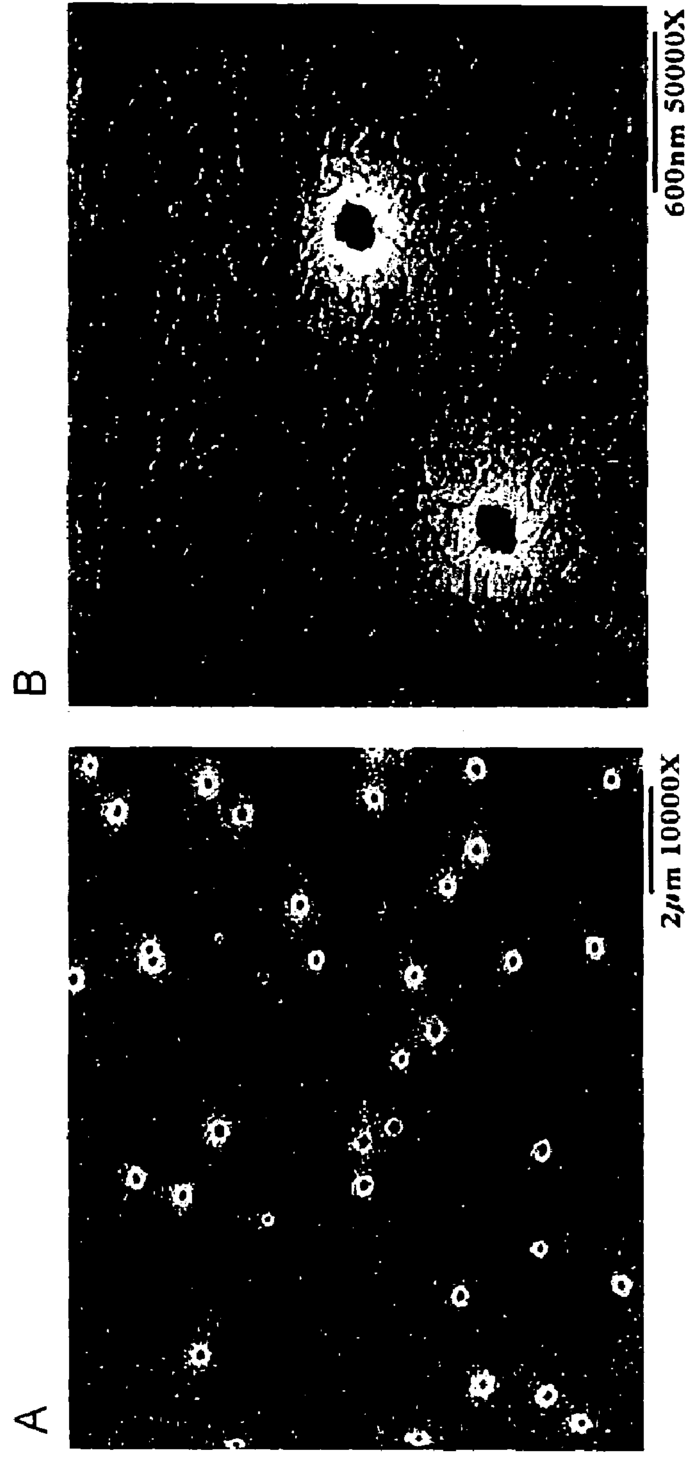
FIGS. 10*a* and *b* shows scanning electron microscope images of the surface of a device in accordance with the invention after photo-electrochemical (PEC) etching for 1.25 min at 10,000× (a) and 50,000× (b).

For etch pit density measurements, the samples were selectively photo-electrochemical (PEC) etched in aqueous KOH solution. FIG. 10 shows the scanning electron microscope images of the surface of a AlGaN/GaN device with a superlattice after PEC etching for 1.25 min.

The difference in the RMS surface roughness was confirmed by atomic force microscopy that showed half that when compared to the sample without superlattice (results not shown). These AFM results are consistent with both the x-ray and Hall measurements.

Depletion C-V profiling showed no parasitic parallel conduction path was formed at the superlattice.

It was found that the dislocation density was reduced by approximately 1 order of magnitude for the sample with superlattice. Grazing incidence x-ray reflection indicated that the surface roughness was improved by almost 50%. The critical difference between with and without SL samples appears in both the discrete localized defect density and the apparent buckling within the mosaic nature of the growth.

Working Example 3

HFET structures were grown by Metal Organic Chemical Vapor Deposition (MOCVD) using triethylaluminum, triethylgallium, and ammonia as precursors with di-silane as dopant. A vertical reactor was used with epitaxial growth occurring at low pressure (76 Torr) and high temperature (~1000° C.) on both sapphire and SiC substrates. MOCVD growth parameters such as temperature, time, and flow rate were modified to optimize properties.

HFET characteristics such as layer thickness, aluminum concentration, and doping level were modified to determine the resulting effect on Hall properties such as mobility, sheet carrier concentration, and sheet conductivity. Non-ideal nucleation temperature/thickness and grow temperature result in poor surface morphology. Determination of surface morphology quality is performed by observation under optical microscope. Optimum nucleation and growth temperature may change due to the geometry of the reactor chamber as well as the thermocouple placement and reactor history. Secondary ion mass spectrometry (SIMS) analysis indicates carbon and oxygen impurities on the order of SIMS detection limits.

The HFET structure consisted of a thin layer of Si doped AlGaN (AlGaN~200 Å) grown on top of a thick (~1.5 micron) GaN buffer. The two dimensional hetero-junction between the GaN and nAlGaN is where high electron mobility conducting channel occurs. Therefore, the surface roughness and dislocation density of the crystal at the heterojunction are of importance, requiring determination of optimum operating parameters as discussed above. The nAlGaN layer supplies carriers, however it also causes alloy scattering (due to different alloy clustering causing variation in the microscopic periodic electric potential) and lower mean free path (due to Si atoms) resulting in lower mobility. An undoped layer of AlGaN (~30 Å) inserted between the nAlGaN and the GaN separates the carriers from the 2D channel resulting in higher mobility, but lower sheet carrier concentration. A thin AlN layer (~10 Å) between the undoped AlGaN layer and the GaN Buffer gives a more abrupt interface.

The AlN spacer was introduced between the GaN buffer and the AlGaN layers to decrease random alloy carrier scattering and improve mobility.

The Hall properties were measured using Ohmic indium contacts using the van der Pauw technique. HFET structures were modified to maximize mobility without losing carriers, ultimately achieving high sheet conductivity. Ideally the temperature window for GaN and AlGaN should be the same, or at least overlap, however this is not always the case.

The dislocation filtering superlattice consisting of five 100 Å layers of AlGaN (25% Al), each separated by a 100 Å layer of GaN was incorporated into the GaN buffer roughly 0.4 microns from the nucleation layer and 1 micron from the HFET layer. In addition to filtering dislocations, the superlattice seemed to reduce cracking, although no quantitative study on this was performed. The superlattice placement, individual super lattice layer thickness, and overall buffer thickness were all changed to determine their effect on the resulting Hall properties. Capacitance-voltage analysis was performed, showing the carrier depth profile to determine if parallel conduction in the super lattice was occurring. No parallel conduction was found.

Working Example 4

Figure 11:
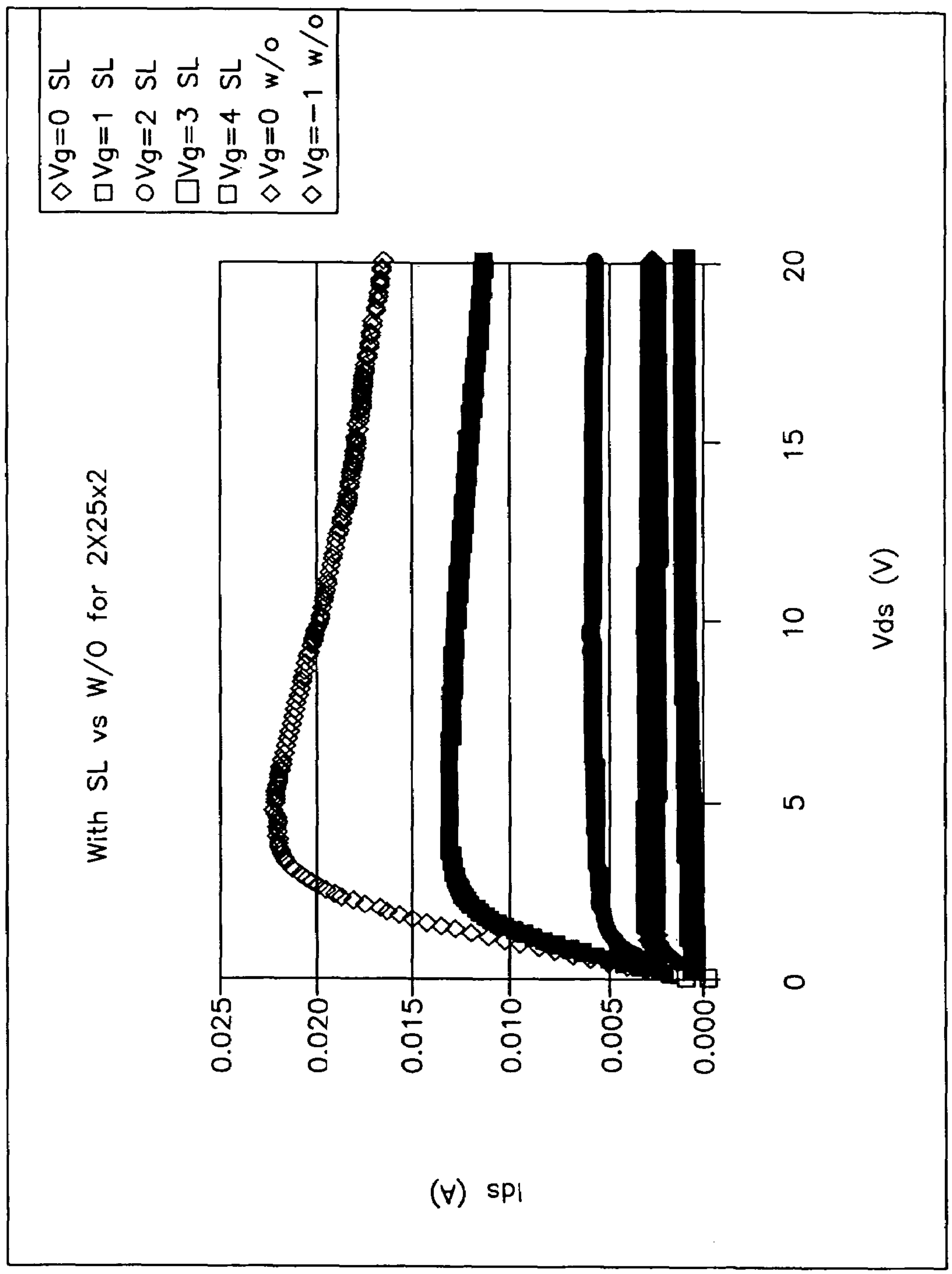
FIG. 11 is a graph comparing the response of a device in accordance with the invention and a device not in accordance with the invention to various gate voltages.

The response of a device fabricated according to Example 1 was compared with a device fabricated according to Example 1 without the superlattice. FIG. 11 shows a graph of the current versus drain voltage at variable gate voltages. As can be seen there, the device with the superlattice exhibits currents that are much higher than the device without the superlattice. The device with the superlattice also shows a comparably larger amount of current for the same difference in gate voltage, a characteristic that is desirable in HFETs.

Working Example 5

Figure 12:
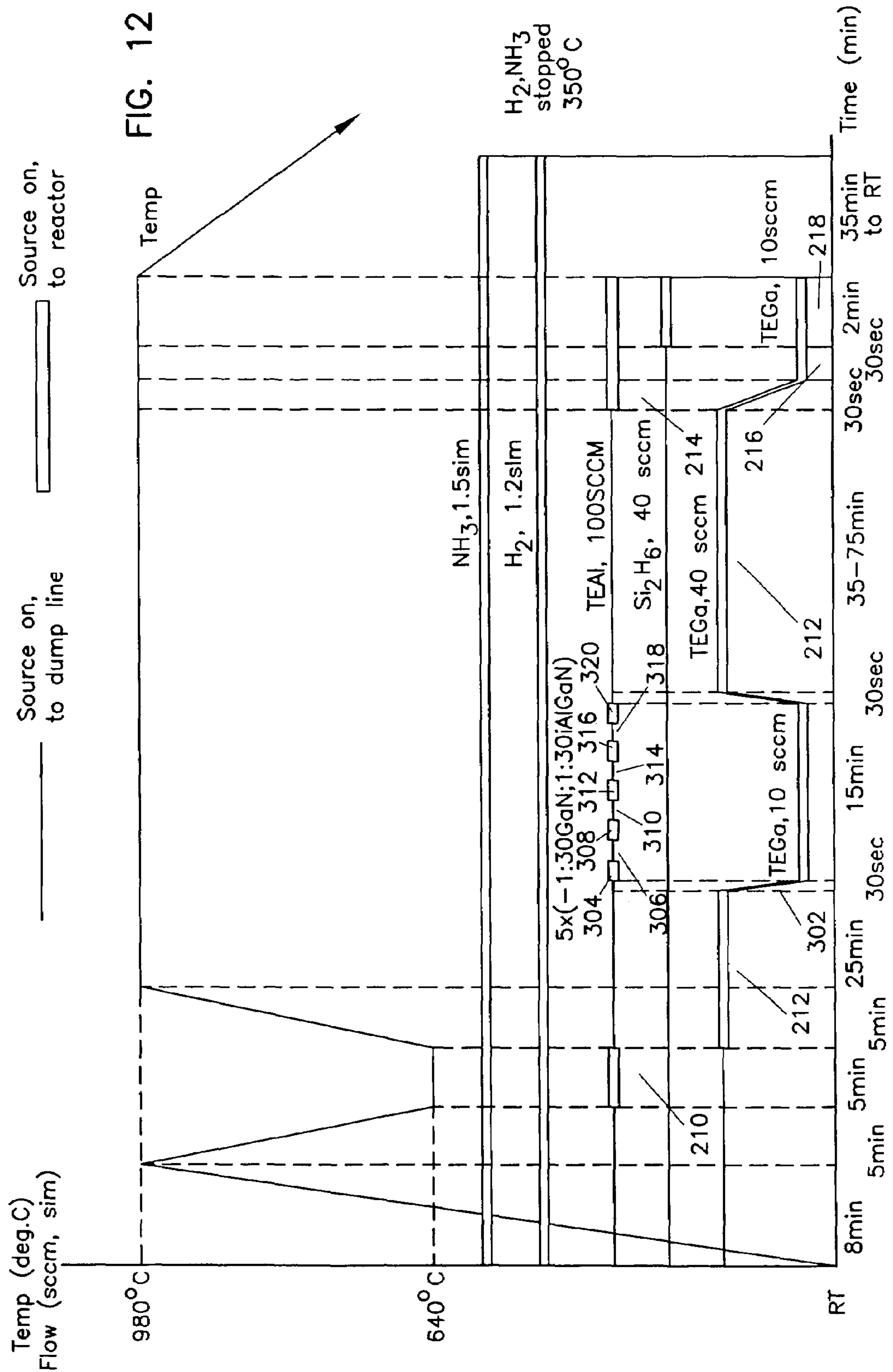
FIG. 12 is a graph depicting temperatures and flow rates utilized in an exemplary method of fabricating a device of the invention.

FIG. 12 is a diagram representing the temperature and flow rate parameters for constructing a device of the invention. These parameters are for fabrication of a device in an inductively heated, 1.25" diameter single wafer vertical reactor. The various portions of a device depicted in FIG. 3 that are formed at the various stages of the fabrication are designated therein utilizing the numeric designations as are used in FIG. 3.

The above specification, examples and data provide a complete description of the manufacture and use of the composition of the invention. Since many embodiments of the invention can be made without departing from the spirit and scope of the invention, the invention resides in the claims hereinafter appended.

The claimed invention is:

1. A semiconductor device comprising:

a substrate comprising silicon or silicon carbide;

an upper buffer region comprised of a group III-nitride semiconductor;

a lower buffer region over said substrate comprised of a group III-nitride semiconductor;

a heterojunction region comprised of a group III-nitride semiconductor and positioned upon said upper buffer region; and a superlattice positioned between said lower buffer region and said upper buffer region, wherein said superlattice comprises individual layers of GaN and $Al_xGa_{1-x}N$;

wherein a group III-nitride semiconductor includes at least nitrogen and a group III element from the list consisting of Al, In, and Ga.

2. The device of claim 1 wherein x is from about 0.01 to about 0.40.

3. The device of claim 2, wherein x is from about 0.02 to about 0.30.

4. The device of claim 1, wherein said superlattice comprises from about 2 to about 500 individual layers.

5. The device of claim 4, wherein said superlattice comprises from about 5 to about 100 individual layers.

6. The device of claim 1, wherein said lower buffer region is about 0.1 to about 3 μm thick.

7. The device of claim 6, wherein said lower buffer region is about 0.2 to about 0.5 μm thick.

8. The device of claim 1, wherein said individual layers of said superlattice are from about 5 to about 200 Å thick.

9. A device comprising: a substrate; a buffer region positioned upon said substrate, wherein said buffer region comprises an upper buffer region and a lower buffer region; a heterojunction region positioned upon said buffer region; and a superlattice positioned between said lower buffer region and said upper buffer region, wherein said superlattice comprises individual layers of GaN and $Al_xGa_{1-x}N$, wherein said device is configured to function as a heterojunction field effect transistor, wherein said heterojunction region comprises a first layer and a second layer, wherein said second layer is positioned directly above said upper buffer region, and said first layer is positioned directly above said second layer, and wherein said first layer and said second layer both comprise $Al_yGa_{1-y}N$, where y has a value of from about 0.1 to 1.

10. the device of claim 9, wherein said first layer is doped and said second layer is undoped.

11. the device of claim 10, wherein said first layer has a thickness of from about 100 to 300 Å, and said second layer has a thickness of from about 2 to 30 Å.

12. A device comprising: a substrate; a buffer region positioned upon said substrate, wherein said buffer region comprises an upper buffer region and a lower buffer region; a heterojunction region positioned upon said buffer region; and a superlattice positioned between said lower buffer region and said upper buffer region, wherein said superlattice comprises individual layers of GaN and $Al_xGa_{1-x}N$, wherein said device is configured to function as a heterojunction field effect transistor, wherein said heterojunction region comprises $Al_bGa_{1-b}N$, where b has a value of from about 0.1 to 1.

13. The device of claim 12, wherein said $Al_bGa_{1-b}N$ is pulse doped.

14. The device of claim 13, wherein said pulse doped $Al_bGa_{1-b}N$ has a trilayer structure with a layer of dopant with a thickness of about 2 to 10 Å between two layers of undoped $Al_bGa_{1-b}N$.

15. group A III-nitride device comprising:

a substrate comprising sapphire;

an upper group III-nitride semiconductor buffer region;

a lower group III-nitride semiconductor buffer region;

a group III-nitride semiconductor heterojunction region positioned upon said upper buffer region; and a superlattice positioned between said lower buffer region and said upper buffer region, wherein said superlattice comprises individual layers of GaN and $Al_xGa_{1-x}N$;

wherein said group III-nitride semiconductor includes at least nitrogen and an element from a group consisting of Al, In, Ga.

16. The device of claim 15, wherein x is about 0.28.

17. The device of claim 15, wherein said superlattice comprises from about 4 to about 50 individual layers.

18. The device of claim 17, wherein said superlattice comprises about 10 individual layers.

19. The device of claim 15, wherein said lower buffer region comprises at least one layer of AlN, and at least one layer of GaN.

20. The device of claim 19, wherein said at least one layer of GaN is about 0.4 μm thick, and said at least one layer of AlN is about 300 Å thick.

21. The device of claim 15, wherein said GaN layers of said superlattice are about 80 Å thick, and said $Al_xGa_{1-x}N$ layers are about 100 Å thick.

22. A device comprising:

a substrate comprising silicon carbide;

an upper group III-nitride semiconductor buffer region;

a lower group III-nitride semiconductor buffer region;

a group III-nitride semiconductor heterojunction region positioned upon said upper buffer region; and a superlattice positioned between said lower buffer region and said upper buffer region, wherein said superlattice comprises individual layers of GaN and $Al_xGa_{1-x}N$;

wherein said group III-nitride semiconductor includes at least nitrogen and an element from the group consisting of Al, In and Ga.

23. The device of claim 22, wherein x is about 0.02.

24. The device of claim 22, wherein said superlattice comprises from about 4 to about 50 individual layers.

25. The device of claim 24, wherein said superlattice comprises about 10 individual layers.

26. The device of claim 22, wherein said lower buffer region comprises at least on layer of AlN, and at least one layer of GaN.

27. The device of claim 26, wherein said at least one layer of GaN is about 0.4 μm thick, and said at least one layer of AlN is about 1000 Å thick.

28. The device of claim 22, wherein said GaN layers of said superlattice are about 80 Å thick, and said $Al_xGa_{1-x}N$ layers are about 100 Å thick.

* * * * *